United States Patent
Jang

(12) 
(10) Patent No.: US 10,868,196 B2
(45) Date of Patent: Dec. 15, 2020

(54) MEMORY DEVICE AND MANUFACTURING METHOD THEREOF

(71) Applicant: Powerchip Semiconductor Manufacturing Corporation, Hsinchu (TW)

(72) Inventor: Wen-Yueh Jang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/362,717

(22) Filed: Mar. 25, 2019

(65) Prior Publication Data

US 2020/0194598 A1 Jun. 18, 2020

(30) Foreign Application Priority Data

Dec. 18, 2018 (TW) .............. 107145666 A

(51) Int. Cl.
*H01L 29/792* (2006.01)
*H01L 29/66* (2006.01)
*H01L 27/11568* (2017.01)
*H01L 21/28* (2006.01)

(52) U.S. Cl.
CPC .... *H01L 29/7923* (2013.01); *H01L 27/11568* (2013.01); *H01L 29/40117* (2019.08); *H01L 29/66833* (2013.01)

(58) Field of Classification Search
CPC ......... H01L 29/40117; H01L 29/66833; H01L 27/11568; H01L 29/7923
See application file for complete search history.

(56) References Cited

U.S. PATENT DOCUMENTS

| 5,424,569 A | 6/1995 | Prall |
| 7,816,728 B2 | 10/2010 | Ho et al. |
| 2004/0130947 A1 | 7/2004 | Fan et al. |
| 2005/0051830 A1 | 3/2005 | Smith |
| 2006/0192266 A1* | 8/2006 | Willer .................. H01L 27/115 257/510 |
| 2007/0145460 A1 | 6/2007 | Lee |

OTHER PUBLICATIONS

"Office Action of Taiwan Counterpart Application", dated Jul. 3, 2019, pp. 1-5.

* cited by examiner

*Primary Examiner* — Changhyun Yi
(74) *Attorney, Agent, or Firm* — JCIPRNET

(57) ABSTRACT

A memory device and a manufacturing method are provided. The memory device includes a substrate, first and second word lines, first and second charge trapping layers, a first drain region and a first source region. The substrate has first and second recesses extending along a first direction. The first and second word lines are respectively disposed in the first and second recesses. The first and second charge trapping layers are respectively disposed in the first and second recesses. The first charge trapping layer is located between the first word line and a sidewall of the first recess. The second charge trapping layer is located between the second word line and a sidewall of the second recess. The first and second drain regions are disposed in the substrate, and respectively extending between the first and the second charge trapping layers along a second direction.

11 Claims, 9 Drawing Sheets

MEMORY DEVICE AND MANUFACTURING METHOD THEREOF

CROSS-REFERENCE TO RELATED APPLICATION

This application claims the priority benefit of Taiwan application serial no. 107145666, filed on Dec. 18, 2018. The entirety of the above-mentioned patent application is hereby incorporated by reference herein and made a part of this specification.

BACKGROUND

Technical Field

The present disclosure relates to a memory device and a manufacturing method thereof, and particularly, to a non-volatile memory device and a manufacturing method thereof.

Description of Related Art

Memory devices for data storage can be categorized into volatile memory devices and non-volatile memory devices. Data stored in volatile memory devices would be lost when power supply is cut off, whereas non-volatile memory devices can retain the stored information even if the power supply is interrupted. Therefore, non-volatile memory devices can be applied in electronic apparatus that are frequently switched off or operated at low power. For instance, such electronic apparatus include mobile phones, memory cards and so forth.

Flash memory devices and silicon-silicon oxide-silicon nitride-silicon oxide-silicon (SONOS) memory devices are non-volatile memory devices. As compared to a flash memory device, charges can be trapped in an insulating layer in a SONOS memory device. However, a single structural unit in the current SONOS memory device only includes two storage unit cells. As the demands on memory capacity continuously grow, studies on increasing storage density of SONOS memory devices become important in the art.

SUMMARY

Accordingly, the present disclosure provides a high storage density memory device and a manufacturing method thereof.

According to some embodiments of the present disclosure, a memory device includes a substrate, first and second word lines, first and second charge trapping layers, a first drain region and a first source region. The substrate has first and second recesses extending along a first direction. The first direction is parallel with a surface of the substrate. The first and second word lines are respectively disposed in the first and second recesses, and extend along the first direction. The first and second charge trapping layers are respectively disposed in the first and second recesses. The first charge trapping layer is located between the first word line and a sidewall of the first recess. The second charge trapping layer is located between the second word line and a sidewall of the second recess. The first drain region and the first source region are disposed in the substrate, and respectively extend between the first and second charge trapping layers along a second direction. The second direction is parallel with the surface of the substrate and intersected with the first direction. The first drain region and the first source region are separated from each other.

In some embodiments, the memory device further includes a first insulating structure and a second insulating structure. The first insulating structure is disposed over a bottom surface of the first recess. The first word line and the first charge trapping layer are separated from the bottom surface of the first recess by the first insulating structure. The second insulating structure is disposed over a bottom surface of the second recess. The second word line and the second charge trapping layer are separated from the bottom surface of the second recess by the second insulating structure.

In some embodiments, the memory device further includes a second drain region and a second source region. The second drain region and the second source region are disposed in the substrate, and respectively in mirror symmetry to the first drain region and the first source region with respect to the first word line or the second word line.

In some embodiments, the memory device further includes signal lines. The signal lines include a first drain line, a second drain line, a first source line and a second source line extending along the second direction over the substrate. The first drain line, the second drain line, the first source line and the second source line are sequentially arranged along the first direction. The first drain region and the first source region are respectively in electrical connection to the first drain line and the first source line. The second drain region and the second source region are respectively in electrical connection to the second drain line and the second source line.

In some embodiments, the first drain line is vertically overlapped with the first drain region and the second drain region. The first source line is vertically overlapped with the first source region and the second source region.

In some embodiments, the second drain region and the second source region are respectively in electrical connection with the second drain line and the second source line through interconnection structures. The interconnection structures extend a direction parallel to the surface of the substrate, and are located between the substrate and the signal lines.

In some embodiments, a top surface of the first word line is lower than the surface of the substrate, and a top surface of the second word line is lower than the surface of the substrate.

According to some embodiments of the present disclosure, a manufacturing method of a memory device includes: forming a first recess and a second recess at a surface of the substrate, wherein the first recess and the second recess extend along a first direction, and the first direction is parallel to the surface of the substrate; respectively forming a first charge trapping layer and a second charge trapping layer on sidewalls of the first recess and the second recess; respectively forming a first word line and a second word line in the first recess and the second recess, wherein the first word line and the second word line are respectively located over bottom surfaces of the first recess and the second recess, and wherein the first word line and the second word line respectively cover surfaces of the first charge trapping layer and the second charge trapping layer; and forming a first drain region and a first source region in portions of the substrate between the first recess and the second recess, wherein the first drain region and the first source region respectively extend between the first charge trapping layer and the second charge trapping layer along a second direction, wherein the second direction is parallel with the surface of the substrate and intersected with the first direction, and wherein the first drain region and the first source region are separated from each other.

In some embodiments, before forming the first charge trapping layer and the second charge trapping layer, the manufacturing method of the memory device further includes: respectively forming a first insulating structure and a second insulating structure in the first recess and the second recess.

In some embodiments, after forming the first word line and the second word line, the manufacturing method of the memory device further includes: removing top portions of the first word line and the second word line, such that a top surface of the first word line is lower than the surface of the substrate, and a top surface of the second word line is lower than the surface of the substrate.

In some embodiments, the manufacturing method of the memory device further includes: forming a second drain region and a second source region in the substrate, wherein the second drain region and the second source region are respectively in mirror symmetry to the first drain region and the first source region with respect to the first word line or the second word line.

In some embodiments, the manufacturing method of the memory device further includes: forming signal lines over the substrate, wherein the signal lines comprise a first drain line, a second drain line, a first source line and a second source line extending along the second direction and arranged along the first direction, wherein the first drain region and the first source region are respectively in electrical connection with the first drain line and the first source line, and wherein the second drain region and the second source region are respectively in electrical connection with the second drain line and the second source line.

In some embodiments, the manufacturing method of the memory device further includes: forming interconnection structures over the substrate, wherein the interconnection structures extend along a direction parallel to the surface of the substrate, and is located between the substrate and the signal lines, and wherein the second drain region and the second source region are respectively in electrical connection with the second drain line and the second source line through the interconnection structures.

As above, in the memory device according to some embodiments of the present disclosure, the drain region and the source region of each structural unit are disposed between adjacent word lines. Based on this configuration, each structural unit may have at least 4 storage units. As compared to a memory device in which a structural unit merely include 2 storage units, the memory device according to some embodiments in the present disclosure has higher storage density. In some embodiments, adjacent structural units or different sets of storage units in the same structural unit may be electrically isolated from each other by adopting a proper driving method for the memory device, and an isolation structure may not be required. Therefore, storage density of the memory device may be further improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
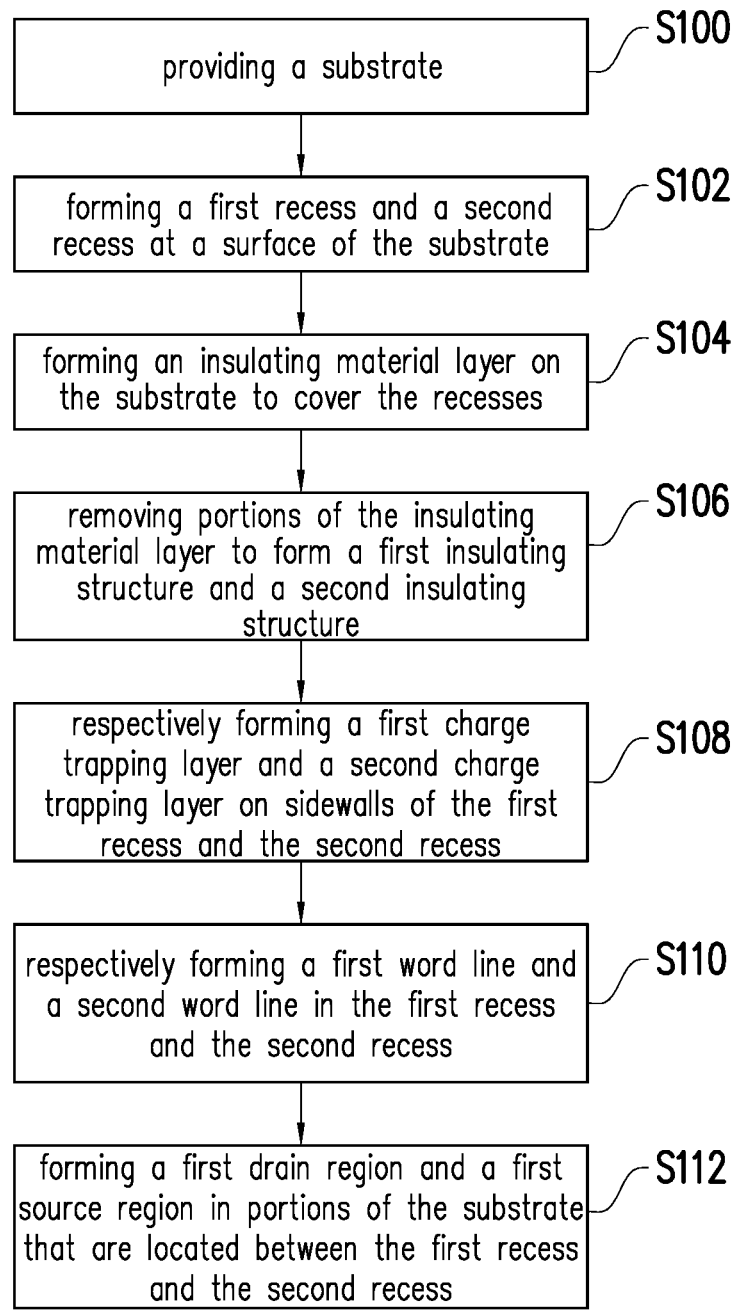
FIG. 1 is a process flow diagram illustrating a manufacturing method of a memory device according to some embodiments in the present disclosure.

FIG. 1 is a process flow diagram illustrating a manufacturing method of a memory device 10 (shown in FIG. 2F) according to some embodiments in the present disclosure. FIG. 2A through FIG. 2F are schematic cross-sectional views and top views illustrating structures at various stages during the manufacturing method of the memory device 10 shown in FIG. 1. In FIG. 2A through FIG. 2F, the schematic top views are illustrated in areas respectively enclosed by a dash line.

Figure 2A:
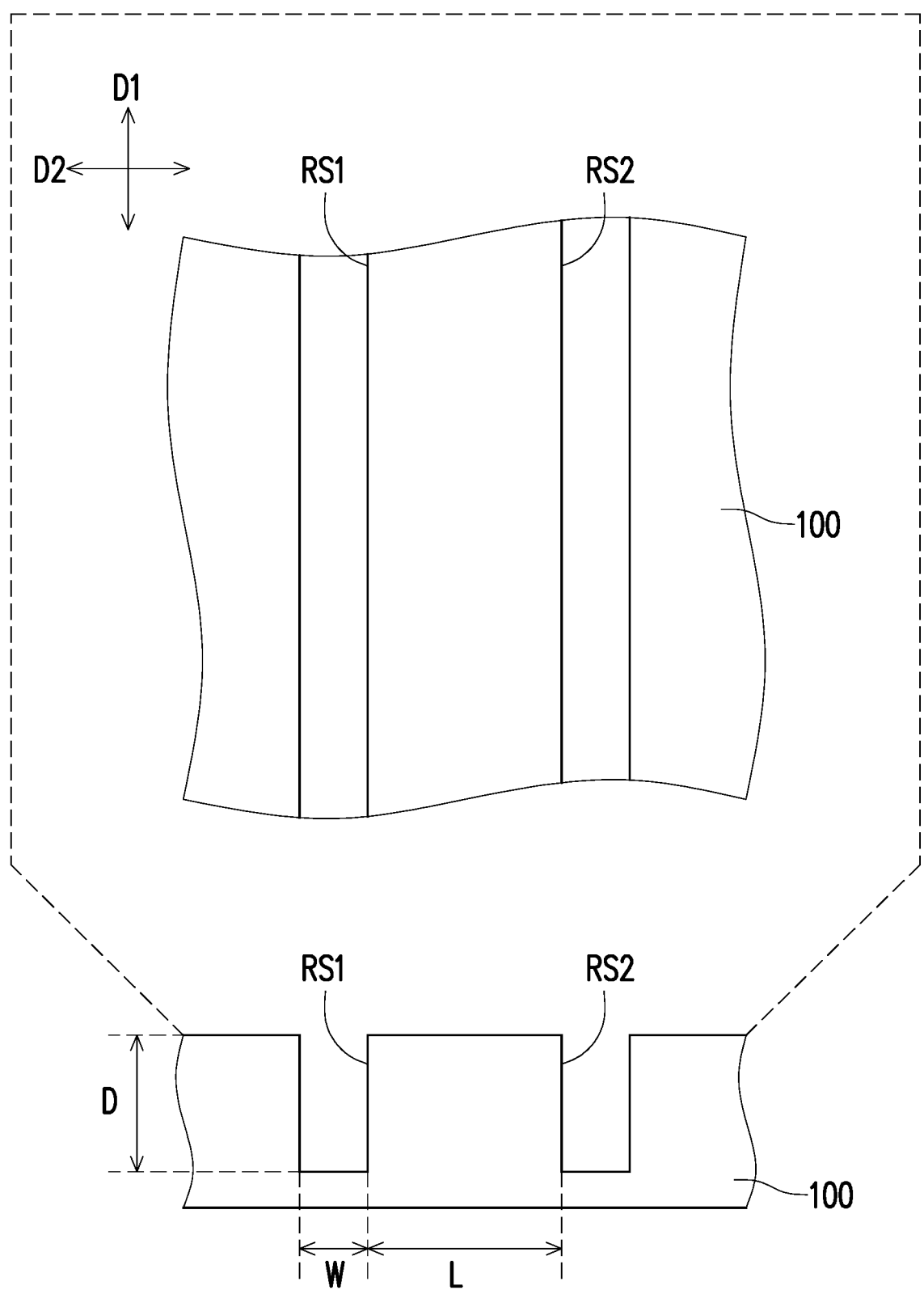
FIG. 2A through FIG. 2F are schematic cross-sectional views and top views illustrating structures at various stages during the manufacturing method of the memory device shown in FIG. 1.

Referring to FIG. 1 and FIG. 2A, step S100 is performed, and a substrate 100 is provided. In some embodiments, the substrate 100 is a semiconductor substrate or a semiconductor-on-insulator (SOI) substrate. The semiconductor material in the semiconductor substrate or the SOI substrate may include an elemental semiconductor, an alloy semiconductor or a compound semiconductor. For instance, the elemental semiconductor may include Si or Ge. The alloy semiconductor may include SiGe, SiC, SiGeC or the like. The compound semiconductor may include a group III-V semiconductor material or a group II-VI semiconductor material. In some embodiments, the substrate 100 may be doped with a first conductive type or a second conductive type complementary to the first conductive type. For instance, the first conductive type may be N-type, whereas the second conductive type may be P-type.

Step S102 is performed, and a first recess RS1 and a second recess RS2 are formed at a surface of the substrate 100. In some embodiments, the first recess RS1 and the second recess RS2 have substantially the same depth D and width W. For instance, the depth D may range from 50 nm to 200 nm, whereas the width may range from 60 nm to 100 nm. In addition, in some embodiments, a spacing L between the first recess RS1 and the second recess RS2 may range from 60 nm to 100 nm. A method for forming the first recess RS1 and the second recess RS2 may include forming a photoresist pattern (not shown) over the substrate 100. Openings in this photoresist pattern define locations and shapes of the first recess RS1 and the second recess RS2. Thereafter, some portions of the substrate 100 exposed by this photoresist pattern are etched by, for example, an anisotropic etching process, so as to form the first recess RS1 and the second recess RS2. Afterwards, the photoresist pattern applied as a mask during the etching process is eventually removed. As shown in the top view enclosed by a dash line in FIG. 2A, the first recess RS1 and the second recess RS2 may be trenches. Specifically, the first recess RS1 and the second recess RS2 both extend along a first direction D1 parallel to a surface of the substrate 100. In addition, the first recess RS1 and the second recess RS2 are arranged along a second direction D2. The second direction D2 is parallel with the surface of the substrate 100, and is intersected with the first direction D1. In some embodiments, the first direction D1 is perpendicular to the second direction D2.

Figure 2B:
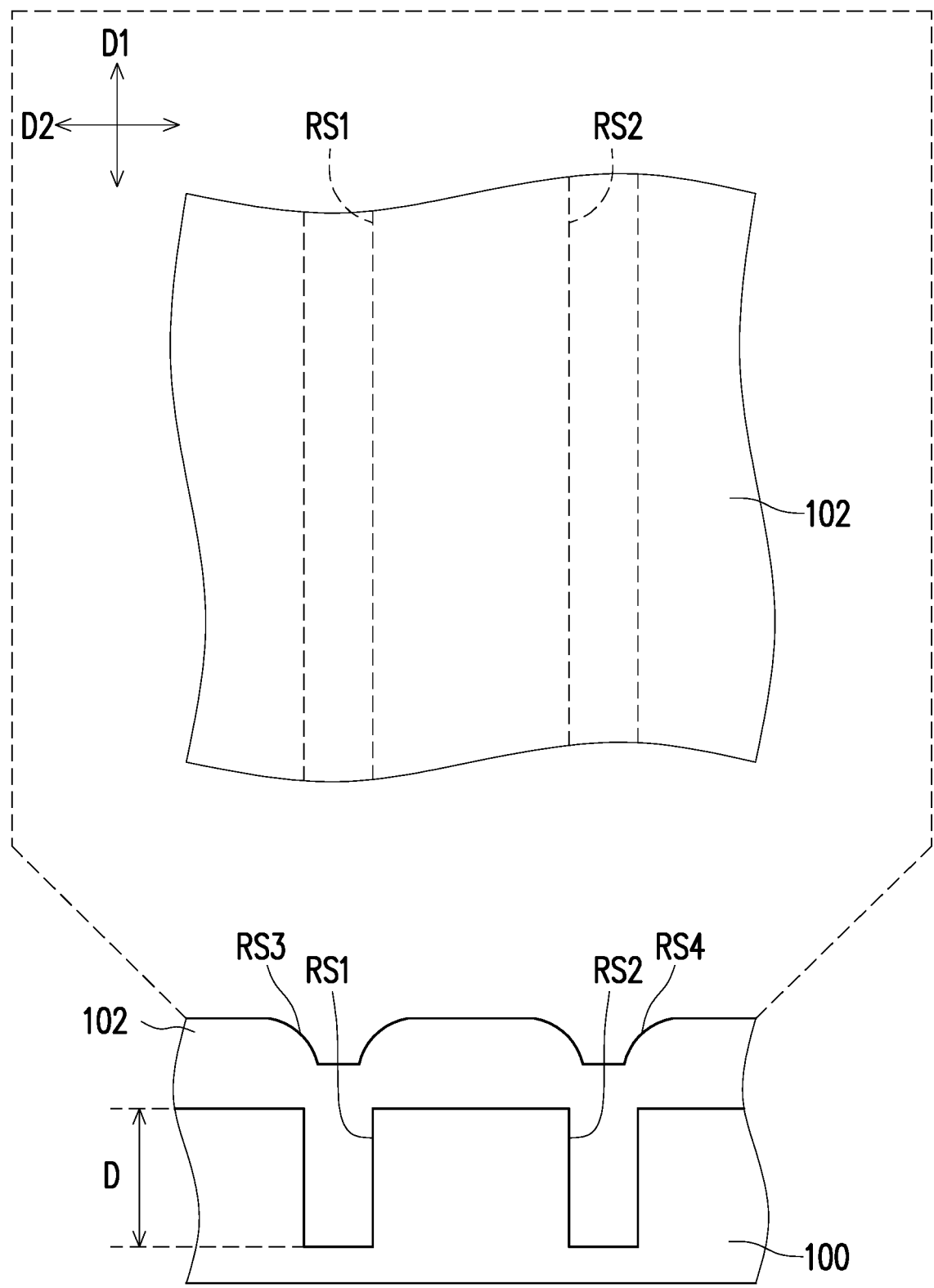

Referring to FIG. 1 and FIG. 2B, step S104 is performed, and an insulating material layer 102 is formed over the substrate 100. The insulating material layer 102 may be globally formed on the substrate 100. In some embodiments, the first recess RS1 and the second recess RS2 may be filled up by the insulating material layer 102, and the insulating material layer 102 may extend over portions of the substrate 100 outside the first recess RS1 and the second recess RS2. In some embodiments, a top surface of the insulating material layer 102 has a recess RS3 and a recess RS4 respectively corresponding to the shapes of the first recess RS1 and the second recess RS2. In these embodiments, depths of the recess RS3 and the recess RS4 are respectively less than the depth D of the first recess RS1 or the second recess RS2. For conciseness, the recess RS3 and the recess RS4 are not illustrated in the top view enclosed by a dash line in FIG. 2B. In addition, in some embodiments, a material of the insulating material layer 102 includes silicon oxide, silicon nitride, other insulating materials or combinations thereof. A method for forming the insulating material layer 102 may include a chemical vapor deposition process or a spin coating process.

Figure 2C:
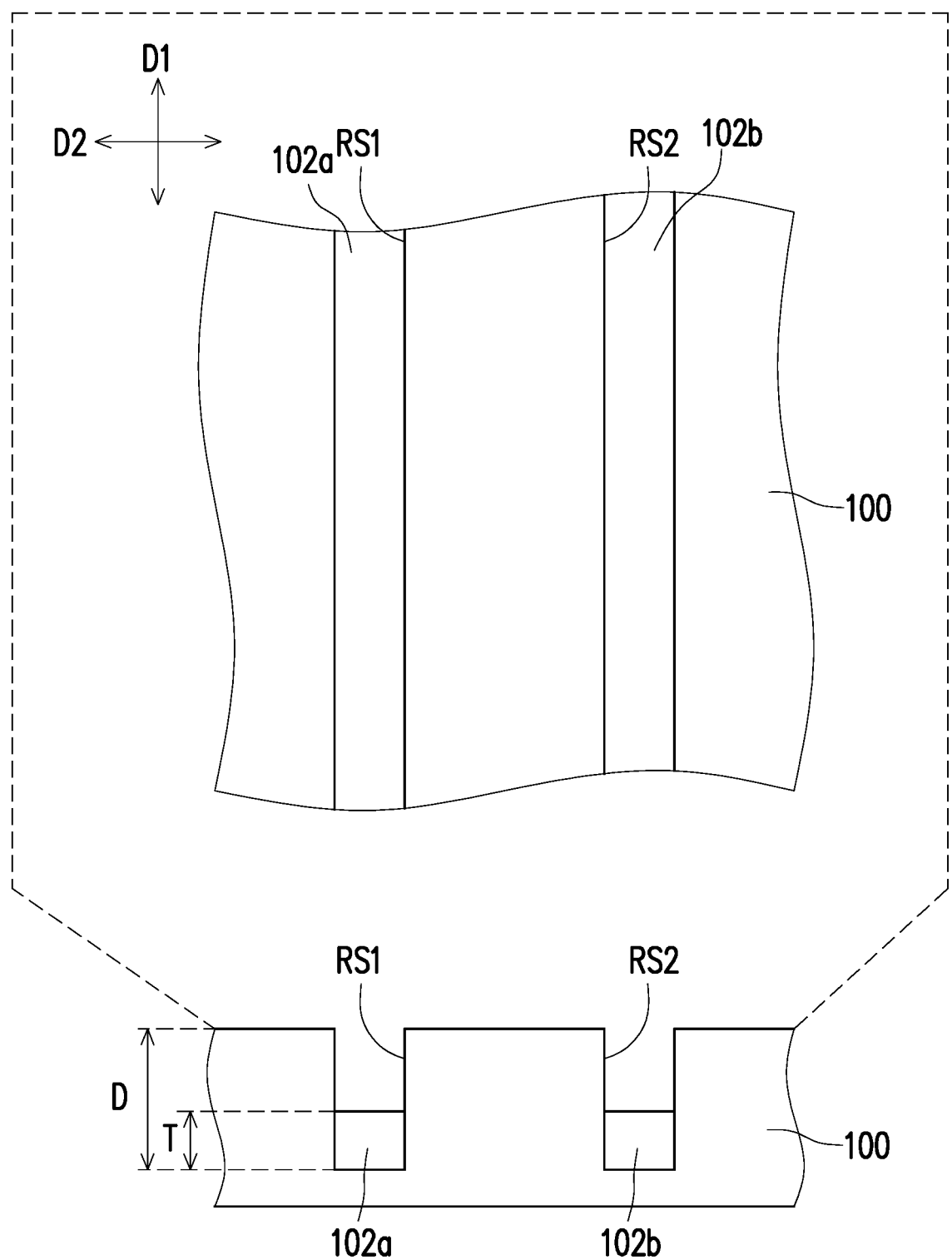

Referring to FIG. 1 and FIG. 2C, step S106 is performed, and portions of the insulating material layer 102 are removed to form a first insulating structure 102a and a second insulating structure 102b. The first insulating structure 102a is located at a bottom region of the first recess RS1 of the substrate 100, whereas the second insulating structure 102b is located at a bottom region of the second recess RS2 of the substrate 100. In some embodiments, the first insulating structure 102a and the second insulating structure 102b have the same thickness T. The thickness T of the first insulating structure 102a or the second insulating structure 102b is less than the depth D of the first recess RS1 or the second recess RS2. For instance, the thickness T of the first insulating structure 102a or the second insulating structure 102b may range from 20 nm to 40 nm. In some embodiments, a method for removing some portions of the insulating material layer 102 to form the first insulating structure 102a and the second insulating structure 102b may include performing a planarization process on the insulating material layer 102, such that top surfaces of the remained portions of the insulating material layer 102 in the first recess RS1 and the second recess RS2 are substantially coplanar with the top surface of the substrate 100. Thereafter, an etching back process may be performed on the remained portions of the insulating material layer 102, to form the first insulating structure 102a and the second insulating structure 102b. For instance, the planarization process may be a chemical mechanical polishing process, and the etching back process may be an anisotropic etching process or an isotropic etching process.

Figure 2D:
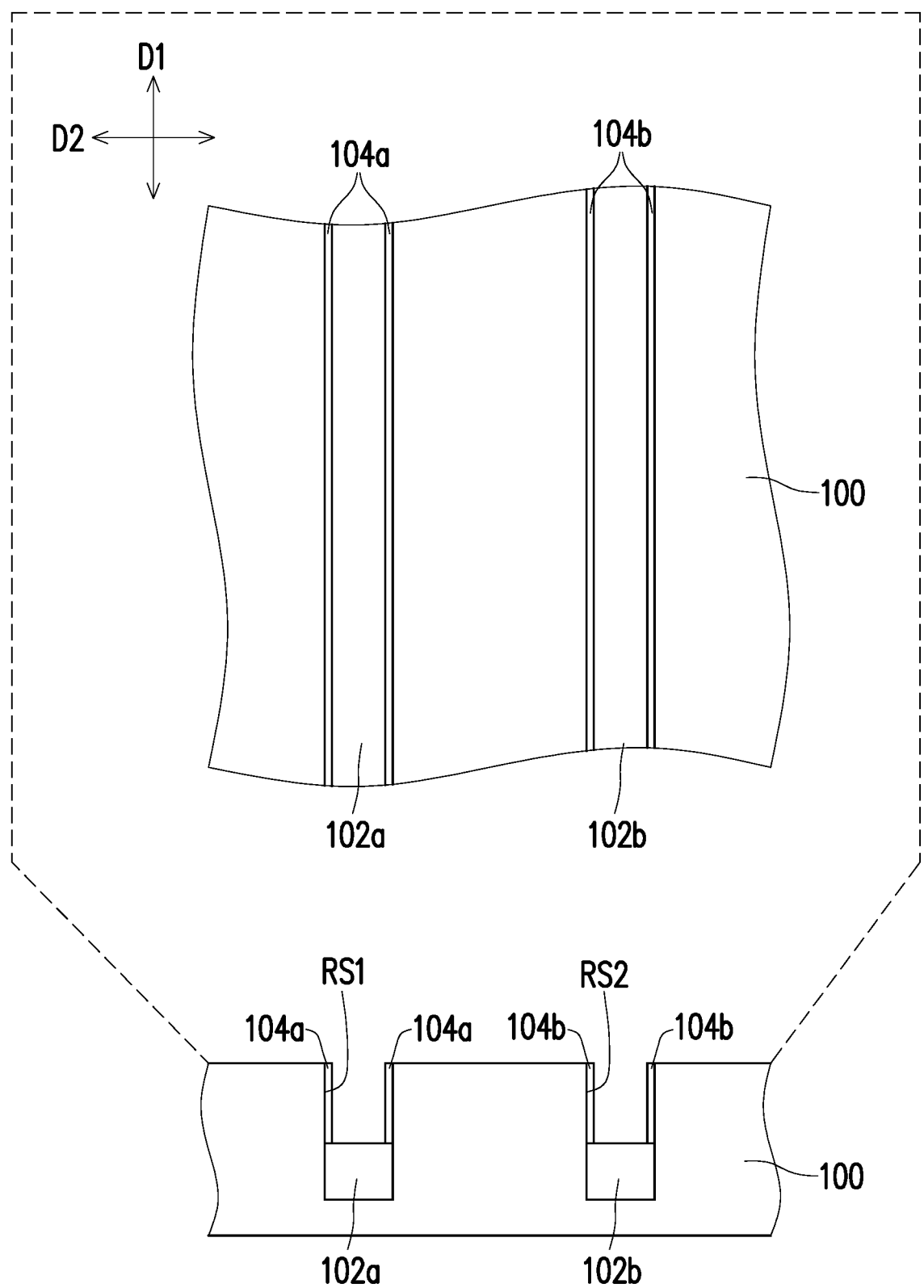

Referring to FIG. 1 and FIG. 2D, step S108 is performed, and a first charge trapping layer 104a and a second charge trapping layer 104b are respectively formed on the sidewalls of the first recess RS1 and the second recess RS2. In some embodiments, the first charge trapping layer 104a is formed over the first insulating structure 102a, and covers the sidewall of the first recess RS1. Similarly, the second charge trapping layer 104b is formed over the second insulating structure 102b, and covers the sidewall of the second recess RS2. As shown in the top view enclosed by a dash line in FIG. 2C, at least some portion of the first charge trapping layer 104a extends along the first direction D1. Similarly, at least some portion of the second charge trapping layer 104b extends along the first direction D1 as well. Even though the first charge trapping layer 104a and the second charge trapping layer 104b are respectively depicted as a single layer structure, the first charge trapping layer 104a and the second charge trapping layer 104b may actually be multi-layer structures. For instance, the first charge trapping layer 104a and the second charge trapping layer 104b may respectively include at least one silicon nitride layer and silicon oxide layers located at opposite sides of each silicon nitride layer, and may respectively be a silicon oxide-silicon nitride-silicon oxide (ONO) multilayer structure. In some embodiments, the first charge trapping layer 104a and the second charge trapping layer 104b may be formed by a thermal oxidation process, a chemical vapor deposition process or a combination thereof. In some embodiments, a charge trapping material layer (not shown) is globally formed in the first place, and horizontally extending portions of the charge trapping material layer over the substrate 100 are removed by an anisotropic etching process. The remained portions of the charge trapping material layer form the first charge trapping layer 104a and the second charge trapping layer 104b respectively located at the sidewalls of the first recess RS1 and the second recess RS2.

Figure 2E:
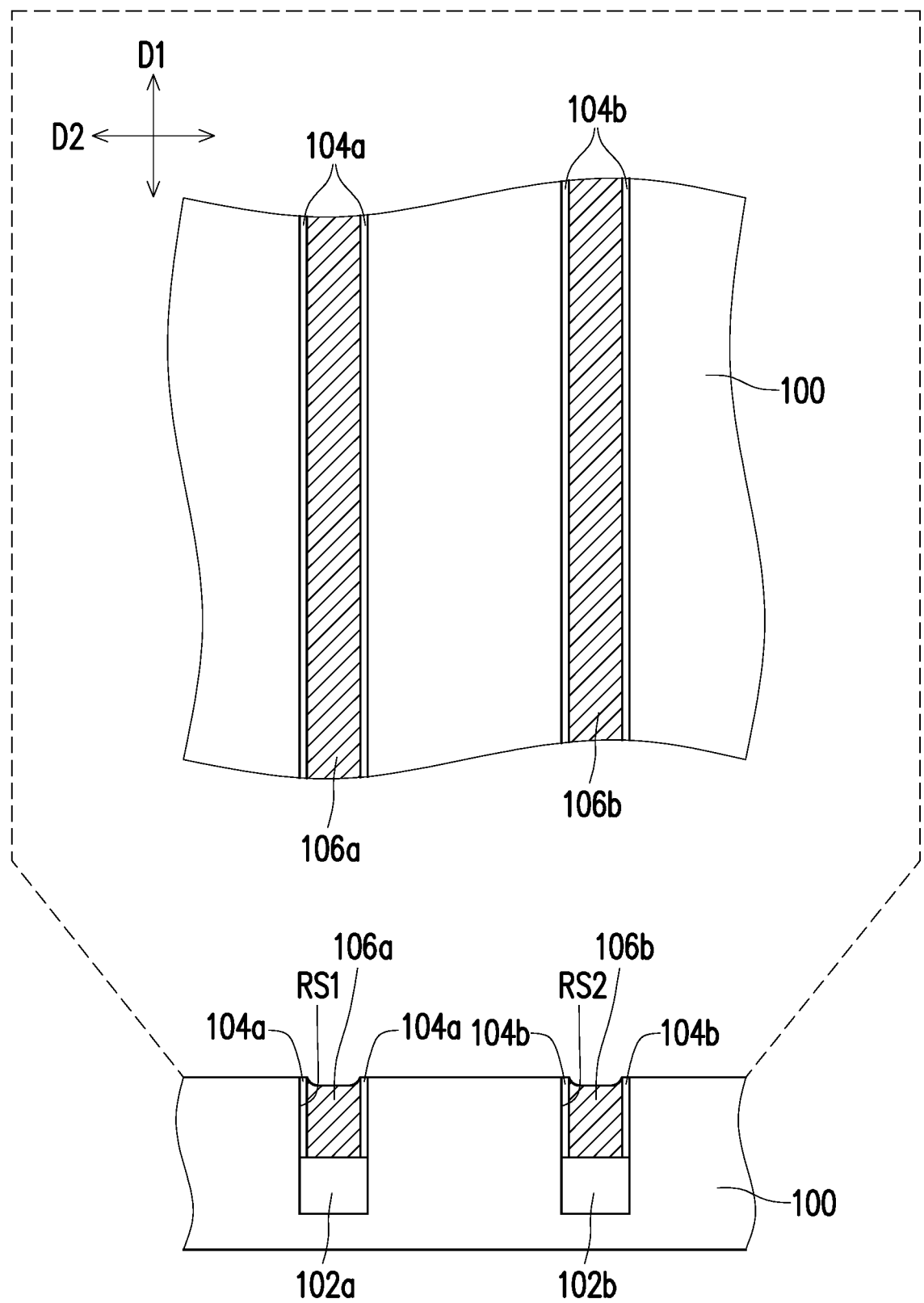

Referring to FIG. 1 and FIG. 2E, step S110 is performed, and a first word line 106a and a second word line 106b are respectively formed in the first recess RS1 and the second recess RS2. In this way, the first word line 106a and the second word line 106b extend along the first direction D1. In addition, the first charge trapping layer 104a is located between the first word line 106a and the sidewall of the first recess RS1, whereas the second charge trapping layer 104b is located between the second word line 106b and the sidewall of the second recess RS2. In some embodiments, the first word line 106a is disposed over the first insulating structure 102a, and covers the surface of the first charge trapping layer 104a. In these embodiments, the first word line 106a and the first charge trapping layer 104a are separated from the bottom surface of the first recess RS1 by the first insulating structure 102a. Similarly, in some embodiments, the second word line 106b is disposed over the second insulating structure 102b, and covers the surface of the second charge trapping layer 104b. In other words, the second word line 106b and the second charge trapping layer 104b are spaced apart from the bottom surface of the second recess RS2 by the second insulating structure 102b. In some embodiments, materials of the first word line 106a and the second word line 106b include polysilicon or other conductive materials. A method for forming the first word line 106a and the second word line 106b may include forming a conductive material layer (not shown) globally covering the structure shown in FIG. 2D. Subsequently, portions of this conductive material layer outside the first recess RS1 and the second recess RS2 are removed by performing a planarization process on the conductive material layer, and the remained portions of the conductive material layer form the first word line 106a and the second word line 106b. For instance, the conductive material layer may be formed by a physical vapor deposition process or a chemical vapor deposition process. In addition, the planarization process may include a chemical mechanical polishing process, an etching back process or a combination thereof.

In some embodiments, after forming the first word line 106a and the second word line 106b, top portions of the first word line 106a and the second word line 106b may be respectively removed. As such, a top surface of the first word line 106a may be lower than a topmost surface of the substrate 100 outside the recesses, and may be lower than a top surface of the first charge trapping layer 104a. Similarly, a top surface of the second word line 106b may be lower than the topmost surface of the substrate 100 outside the recesses, and may be lower than a top surface of the second charge trapping layer 104b. For instance, a method for removing the top portions of the first word line 106a and the second word line 106b may include an etching back process. During removal of the top portions of the first word line 106a and the second word line 106b, residual conductive materials left on the substrate 100 may be removed as well. As such, electrical shorting or crosstalk between the first word line 106a and the second word line 106b can be effectively avoided.

Figure 2F:
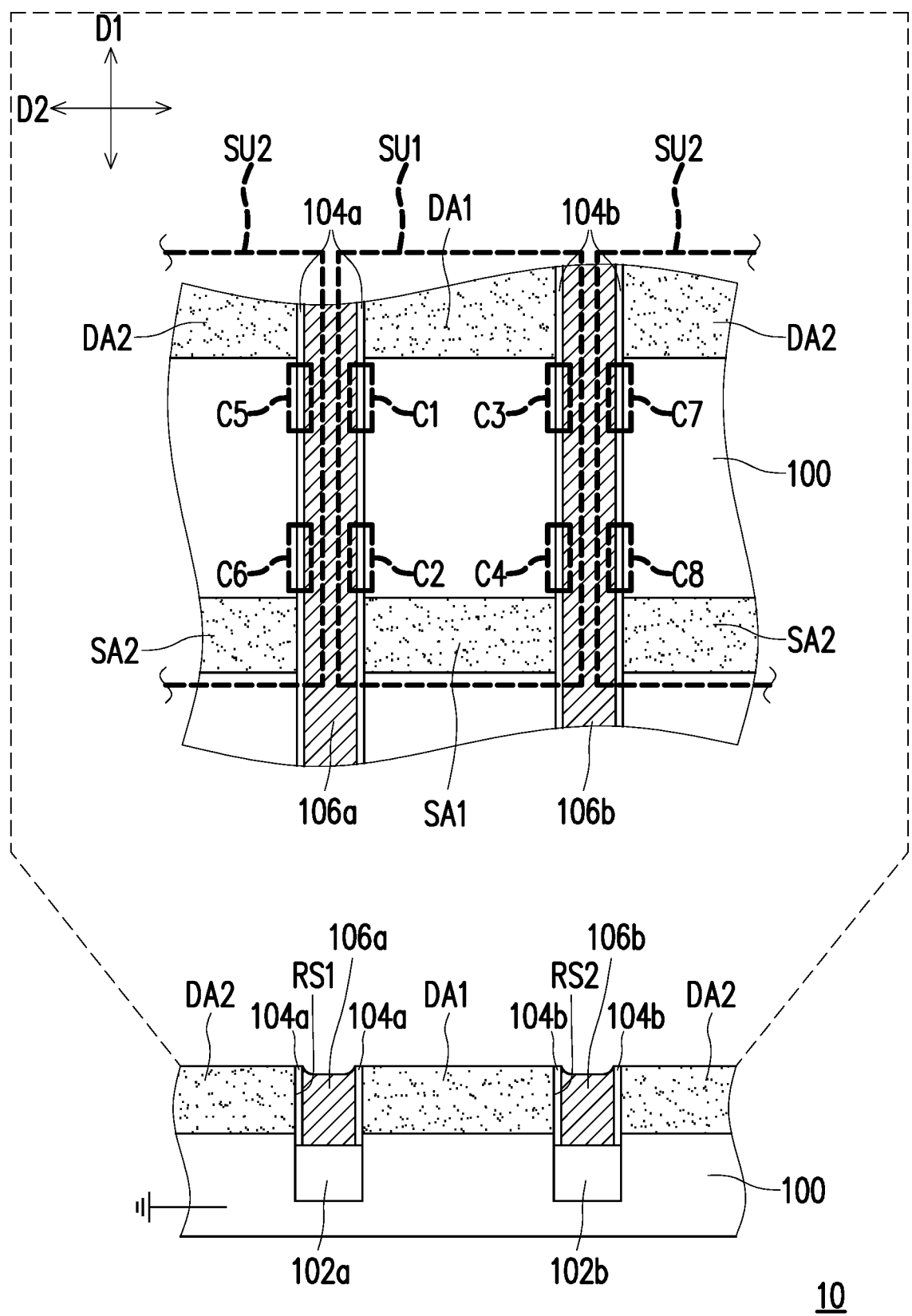

Referring to FIG. 1 and FIG. 2F, step S112 is performed, and first drain region DA1 and a first source region SA1 are formed in portions of the substrate 100 that are located between the first recess RS1 and the second recess RS2. As shown in the top view enclosed by a dash line in FIG. 2F, the first drain region DA1 and the first source region SA1 respectively extend between the first charge trapping layer 104a and the second charge trapping layer 104b along the second direction D2, and are separated from each other. It should be noted that, FIG. 2F merely illustrates one configuration of the first drain region DA1 and the first source region SA1. In alternative embodiments, locations of the first drain region DA1 and the first source region SA1 may be switched. Embodiments of the present disclosure are not limited to the configuration of the first drain region DA1 and the first source region SA1. In addition, the first drain region DA1 and the first source region SA1 may have the same conductive type, such as N-type or P-type.

In some embodiments, a method for forming the first drain region DA1 and the first source region SA1 may include forming a photoresist pattern (not shown) over the structure shown in FIG. 2E. This photoresist pattern has openings extending along the second direction D2. The openings of the photoresist pattern define locations of the first drain region DA1 and the first source region SA1. Subsequently, an ion implantation process is performed with the photoresist pattern used as a mask, so as to form the first drain region DA1 and the first source region SA1 in the exposed portions of the substrate 100. In some embodiments, the openings of the photoresist pattern not only expose some portions of the substrate 100, but may also expose some portions of the first word line 106a, the second word line 106b, the first charge trapping layer 104a and the second charge trapping layer 104b. The first word line 106a and the second word line 106b are made of a conductive material, whereas the first charge trapping layer 104a and the second charge trapping layer 104b are made of an insulating material. Accordingly, conductivity of the first word line 106a, the second word line 106b, the first charge trapping layer 104a and the second charge trapping layer 104b would not be influenced during the ion implantation process.

Up to here, manufacturing of a memory device 10 according to some embodiments is completed. In the memory device 10, a region enclosed by the first word line 106a, the second word line 106b, the first drain region DA1 and the first source region SA1 can be regarded as a structural unit SU1. The structural unit SU1 may include 4 storage units. For instance, the structural unit US1 may include a storage unit C1, a storage unit C2, a storage unit C3 and a storage unit C4. The storage unit C1 and the storage unit C2 are located in the first charge trapping layer 104a. The storage unit C1 is located in a portion of the first charge trapping layer 104a that is close to the first drain region DA1, whereas the storage unit C2 is located in another portion of the first charge trapping layer 104a that is close to the first source region SA1. On the other hand, the storage unit C3 and the storage unit C4 are located in the second charge trapping layer 104b. The storage unit C3 is located in a portion of the second charge trapping layer 104b that is close to the first drain region DA1, whereas the storage unit C4 is located in another portion of the second charge trapping layer 104b that is close to the first source region SA1.

During operation of the memory device 10, the first drain region DA1 and the first word line 106a may receive a working voltage, and the first source region SA1 and the second word line 106b may receive a reference voltage. In this way, a set of storage units including the storage units C1, C2 can be independently controlled. Similarly, the first drain region DA1 and the second word line 106b may receive a working voltage, and the first source region SA1 and the first word line 106a may receive a reference voltage. In this way, a set of storage units including the storage units C3, C4 can be independently controlled. Therefore, the storage units C1, C2 and the storage units C3, C4 can be independently controlled. In addition, during operation of the memory device 10, the substrate 100 may be configured to receive a reference voltage.

Even though only a single first word line 106a and a single second word line 106b are depicted in FIG. 2F, the memory device 10 according to some embodiments in the present disclosure may actually include multiple first word lines 106a and multiple second word lines 106b. In these embodiments, the first word lines 106a and the second word lines 106b may be alternately arranged along the second direction D2. Correspondingly, the substrate 100 may have multiple first recesses RS1 and multiple second recesses RS2 that may accommodate the first word lines 106a and the second word lines 106b. In addition, multiple first charge trapping layers 104a are respectively disposed between one of the first word lines 106a and the sidewall of the corresponding first recess RS1, and multiple second charge trapping layers 104b are respectively disposed between one of the second word lines 106b and the sidewall of the corresponding second recess RS2. In some embodiments, during the formation of the first drain region DA1 and the first source region SA1, a second drain region DA2 and a second source region SA2 may also be formed in the exposed portions of the substrate 100. In these embodiments, the first drain region DA1, the first source region SA1, the second drain region DA2 and the second source region SA2 may have the same conductive type. The memory device 10 may include a plurality of the first drain regions DA1, a plurality of the first source regions SA1, a plurality of the second drain regions DA2 and a plurality of the second source regions SA2. The first drain regions DA1 and the second drain regions DA2 may alternately arranged along the second direction D2, and one of the second drain regions DA2 is substantially in mirror symmetry with one of the first drain regions DA1 with respect to the first word line 106a or the second word line 106b therebetween. Similarly, the first source regions SA1 and the second source regions SA2 may alternately arranged along the second direction D2, and one of the second source regions SA2 is substantially in mirror symmetry with one of the first source regions SA1 with respect to the first word line 106a or the second word line 106b therebetween.

Therefore, in the memory device 10 according to some embodiments in the present disclosure, a region enclosed by adjacent first word line 106a and second word line 106b as well as the second drain region DA2 and the second source region SA2 between these adjacent first word line 106a and second word line 106b can be regarded as a structural unit SU2. As similar to the structural unit SU1, the structural unit SU2 may also include 4 storage units. For instance, the structural unit SU2 may include a storage unit C5, a storage unit C6, a storage unit C7 and a storage unit C8. The storage unit C5 and the storage unit C6 are located in the first charge trapping layer 104a. The storage unit C5 is located in a portion of the first charge trapping layer 104a that is close to the second drain region DA2, whereas the storage unit C6 is located in another portion of the first charge trapping layer 104a that is close to the second source region SA2. On the other hand, the storage unit C7 and the storage unit C8 are located in the second charge trapping layer 104b. The storage unit C7 is located in a portion of the second charge trapping layer 104b that is close to the second drain region DA2, whereas the storage unit C8 is located in another portion of the second charge trapping layer 104b that is close to the second source region SA2.

As above, each structural unit of the memory device according to some embodiments in the present disclosure may include at least 4 storage units. As compared to a memory device in which a structural unit merely include 2 storage units, the memory device of some embodiments in the present disclosure has higher storage density. In addition, each set of storage units in a structural unit of the memory device according to some embodiments of the present disclosure can be independently controlled by selecting a proper driving method.

Figure 3:
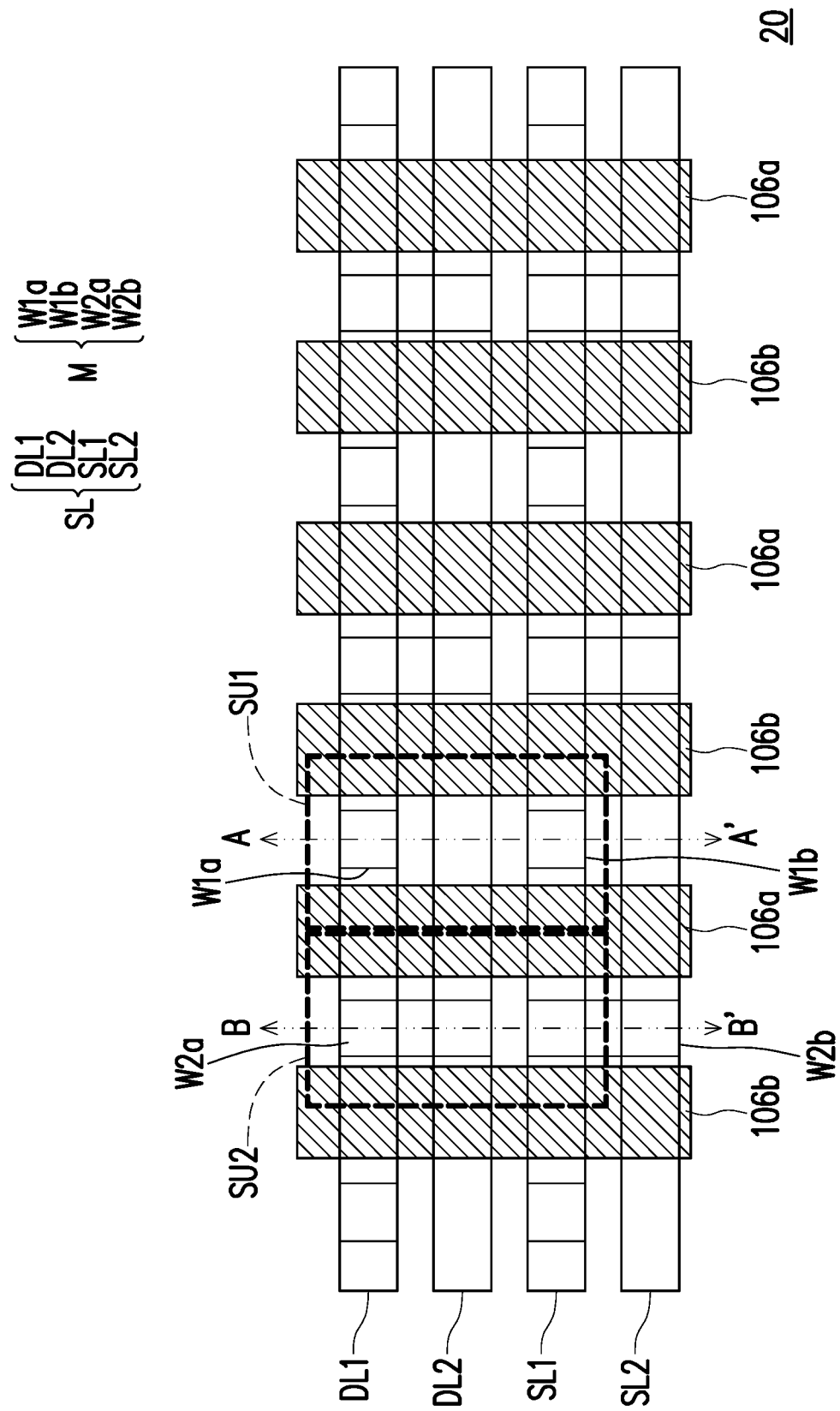
FIG. 3 is a schematic top view illustrating a memory device according to some embodiments of the present disclosure.
Figure 3A:
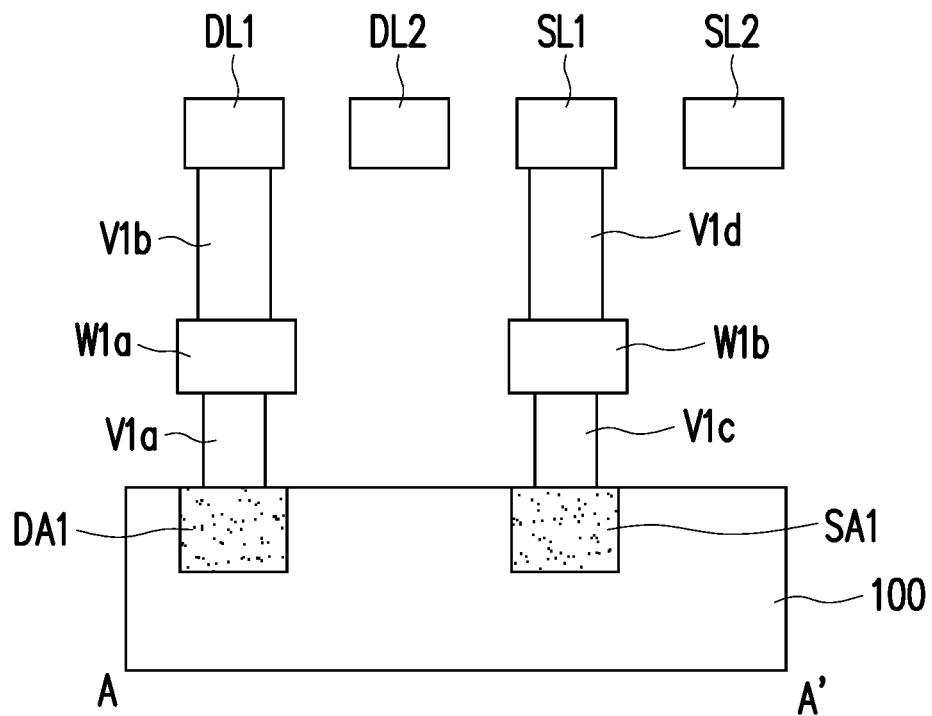
FIG. 3A is a schematic cross-sectional view along a line A-A' shown in FIG. 3.
Figure 3B:
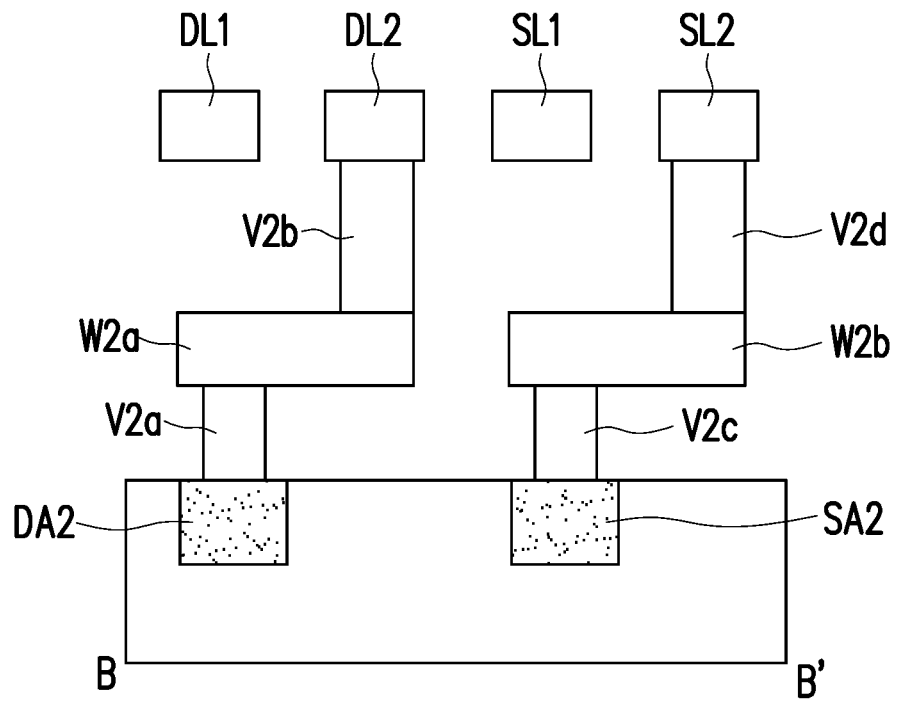
FIG. 3B is a schematic cross-sectional view along a line B-B' shown in FIG. 3.

FIG. 3 is a schematic top view illustrating a memory device 20 according to some embodiments of the present disclosure. FIG. 3A is a schematic cross-sectional view along a line A-A' shown in FIG. 3. FIG. 3B is a schematic cross-sectional view along a line B-B' shown in FIG. 3.

The memory device 20 shown in FIG. 3 is similar to the memory device 10 shown in FIG. 2F. Only differences therebetween will be described, the like or the same parts will not be repeated again. Specifically, the memory device 20 shown in FIG. 3F includes a plurality of the structural units SU1 and a plurality of the structural units SU2, and further includes interconnection structures M and signal line SL. It should be noted that, for conciseness, the substrate 100, the first charge trapping layer 104a and the second charge trapping layer 104b are omitted in FIG. 3. In addition, only a single structural unit SU1 and a single structural unit SU2 are labeled in FIG. 3.

Please referring to FIG. 1, FIG. 3, FIG. 3A and FIG. 3B, in some embodiments, the interconnection structures M and the signal lines SL may be sequentially formed over the substrate 100 (not shown) after forming the first drain region DA1, the first source region SA1, the second drain region DA2 and the second source region SA2. Referring to FIG. 3, even though only a single set of signal lines SL are depicted in FIG. 3, the memory device 20 may actually include multiple sets of signal lines SL. In some embodiments, one set of signal lines SL include a first drain line DL1, a second drain line DL2, a first source line SL1 and a second source line SL2 extending along the second direction D2 and arranged along the first direction D1. The first drain line DL1, the second drain line DL2, the first source line SL1 and the second source line SL2 may be disposed in one or more dielectric layer(s) (not shown), and may be substantially located at the same height. In these embodiments, the extending direction of the first drain line DL1, the second drain line DL2, the first source line SL1 and the second source line SL2 (i.e., the second direction D2) is intersected with the extending direction of the first word line 106a and the second word line 106b (i.e., the first direction D1). In addition, the first drain line DL1 is vertically overlapped with the first drain regions DA1 and the second drain lines DA2 arranged in the same row, and the first source line SL1 is vertically overlapped with the first source regions SA1 and the second source regions SA2 arranged in the same row. On the other hand, the second drain line DL2 is disposed between the first drain line DL1 and the first source line SL1, and the second source line SL2 is disposed at a side of the first source line SL1 that is opposite to the second drain line DL2. Accordingly, the second drain line DL2 and the second source line SL2 are not overlapped with the first drain region DA1, the first source region SA1, the second drain region DA2 and the second source region SA2.

Referring to FIG. 3, FIG. 3A and FIG. 3B, the interconnection structures M are disposed between the signal lines SL and the structural unit SU1/SU2, and extend along a direction parallel to a surface of the substrate 100. In other words, a height of the interconnection structures M is lower than a height of the signal lines SL. In addition, the interconnection structures M are electrically connected between the signal lines SL and the structural unit SU1/SU2. It should be noted that, even though only a set of interconnection structures M are depicted in FIG. 3, the memory device 20 may actually include multiple sets of interconnection structures M.

In some embodiments, a single set of interconnection structures M include a first wiring W1a, a first wiring W1b, a second wiring W2a and a second wiring W2b. The first wiring W1a is vertically overlapped with the first drain region DA1 and the first drain line DL1, whereas the first wiring W1b is vertically overlapped with the first source region SA1 and the first source line SL1. In some embodiments, the first wiring W1a is electrically connected with the first drain region DA1 and the first drain line DL1 through a conductive via V1a and a conductive via V1b, whereas the first wiring W1b is electrically connected to the first source region SA1 and the first source line SL1 through a conductive via V1c and a conductive V1d. In addition, the first wiring W1a and the first wiring W1b are not electrically connected with the second drain line DL2 and the second source line SL2. On the other hand, the second wiring W2a is electrically connected between the second drain region DA2 and the second drain line DL2, whereas the second wiring W2b is electrically connected between the second source region SA2 and the second source line SL2. In some embodiments, the second wiring W2a extends from above the second drain region DA2 to below the second drain line DL2 along the first direction D1, whereas the second wiring W2b extends from above the second source region SA2 to below the second source line SL2 along the first direction D1. In some embodiments, the second wiring W2a is electrically connected with the second drain region DA2 and the second drain line DL2 through a conductive via V2a and a conductive via V2b, whereas the second wiring W2b is electrically connected with the second source region SA2 and the second source line SL2 through a conductive via V2c and a conductive via V2d. In addition, the second wiring W2a and the second wiring W2b are respectively overlapped with the first drain line DL1 and the first source line SL1, but are not electrically connected with the first drain line DL1 and the first source line SL1.

Therefore, the structural unit SU1 may be independently controlled by a set of the first drain line DL1 and the first source line SL1, whereas the structural unit Su2 may be independently controlled by a set of the second drain line DL2 and the second source line SL2. In other words, crosstalk between the structural unit SU1 and the structural unit SU2 during operation of the memory device 20 may be avoided. Moreover, in some embodiments, the storage units of the structural unit SU1/SU2 that are close to the first word line 106a or the second word line 106b (e.g. the storage units C1, C2 or the storage units C3, C4 shown in FIG. 2F) may be independently controlled. For instance, during programming operation of the storage units C1, C2 of the structural unit SU1 at opposite sides of the first word line 104a, the first drain line DL1 and the first word line 104a may be configured to receive a working voltage (e.g., 5V), and the first source line SL1, the second drain line DL2, the second source line SL2 and the second word line 104b may be configured to receive a reference voltage (e.g., 0V). Similarly, during erasing operation of the storage units C1, C2 of the structural unit SU1 at opposite sides of the first word line 104a, the first drain line DL1 and the first word line 104a may be configured to receive an erasing voltage (e.g., −5V), whereas the first source line SL1, the second drain line DL2 and the second source line SL2 are configured to be electrically floated, and the second word line 104b may be configured to receive the reference voltage (e.g., 0V). Accordingly, during programming operation or erasing operation of the storage units C1, C2 of the structural unit SU1, interference on the storage units C3, C4 of the same structural unit SU1 and all storage units in the structural unit SU2 may be avoided.

Based on the configuration of the signal lines SL and the interconnection structures M, the memory device 20 according to some embodiments of the present disclosure may electrically isolate adjacent structural units or different sets of storage units in the same structural unit with a proper driving method. Therefore, it is not necessary to dispose an isolation structure in/over the substrate 100. As a result, storage density of the memory device 20 may by further improved.

As above, in the memory device according to some embodiments of the present disclosure, the drain region and the source region of each structural unit are disposed between adjacent word lines. Based on this configuration, each structural unit may have at least 4 storage units. As compared to a memory device in which a structural unit merely includes 2 storage units, the memory device according to some embodiments in the present disclosure has higher storage density. In some embodiments, adjacent structural units or different sets of storage units in the same structural unit may be electrically isolated from each other by adopting a proper driving method for the memory device, and an isolation structure may not be required. Therefore, storage density of the memory device may be further improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A memory device, comprising:
a substrate, having a first recess and a second recess extending along a first direction, wherein the first direction is parallel with a surface of the substrate;
a first word line and a second word line, respectively disposed in the first recess and the second recess, and extending along the first direction;
a first charge trapping layer and a second charge trapping layer, respectively disposed in the first recess and the second recess, wherein the first charge trapping layer is located between the first word line and a sidewall of the first recess, and wherein the second charge trapping layer is located between the second word line and a sidewall of the second recess;
a first drain region and a first source region, disposed in the substrate, and respectively extending between the first charge trapping layer and the second charge trapping layer along a second direction, wherein the second direction is parallel with the surface of the substrate and intersected with the first direction, and wherein the first drain region and the first source region are separated from each other; and
first and second insulating structures, disposed in the first and second recesses, respectively, wherein the first word line and the first charge trapping layer stand on the first insulating structure, wherein the second word line and the second charge trapping layer stand on the second insulating structure, and wherein a top end of the first insulating structure is lower than bottom ends of the first drain region and the first source region.

2. The memory device of claim 1, further comprising:
a second drain region and a second source region, disposed in the substrate, and respectively in mirror symmetry to the first drain region and the first source region with respect to the first word line or the second word line.

3. The memory device of claim 2, further comprising:
signal lines, comprising a first drain line, a second drain line, a first source line and a second source line extending along the second direction over the substrate, wherein the first drain line, the second drain line, the first source line and the second source line are sequentially arranged along the first direction, wherein the first drain region and the first source region are respectively in electrical connection to the first drain line and the first source line, and wherein the second drain region and the second source region are respectively in electrical connection to the second drain line and the second source line.

4. The memory device of claim 3, wherein the first drain line is vertically overlapped with the first drain region and the second drain region, and wherein the first source line is vertically overlapped with the first source region and the second source region.

5. The memory device of claim 4, wherein the second drain region and the second source region are respectively in electrical connection with the second drain line and the second source line through interconnection structures, and wherein the interconnection structures extend a direction parallel to the surface of the substrate, and are located between the substrate and the signal lines.

6. The memory device of claim 1, wherein a top surface of the first word line is lower than the surface of the substrate, and a top surface of the second word line is lower than the surface of the substrate.

7. A manufacturing method of a memory device, comprising:

forming a first recess and a second recess at a surface of a substrate, wherein the first recess and the second recess extend along a first direction, and the first direction is parallel to the surface of the substrate;

forming a first insulating structure and a second insulating structure in the first recess and the second recess, respectively, wherein a method for forming the first and second insulating structures comprises:

forming an insulating material layer on the substrate after forming the first and second recesses; and removing portions of the insulating material layer in upper regions of the first and second recesses and above the surface of the substrate, wherein portions of the insulating material layer in lower regions of the first and second recesses remain and form the first and second insulating structures;

respectively forming a first charge trapping layer and a second charge trapping layer on sidewalls of the first recess and the second recess after forming the first and second insulating structures, wherein the first and second charge trapping layers stand on the first and second insulating structures, respectively;

respectively forming a first word line and a second word line in the first recess and the second recess, wherein the first word line and the second word line are respectively located over bottom surfaces of the first recess and the second recess, wherein the first word line and the second word line respectively cover surfaces of the first charge trapping layer and the second charge trapping layer, and wherein the first and second word lines stand on the first and second insulating structures, respectively; and forming a first drain region and a first source region in portions of the substrate between the first recess and the second recess, wherein the first drain region and the first source region respectively extend between the first charge trapping layer and the second charge trapping layer along a second direction, wherein the second direction is parallel with the surface of the substrate and intersected with the first direction, and wherein the first drain region and the first source region are separated from each other.

8. The manufacturing method of the memory device of claim 7, after forming the first word line and the second word line, further comprising:

removing top portions of the first word line and the second word line, such that a top surface of the first word line is lower than the surface of the substrate, and a top surface of the second word line is lower than the surface of the substrate.

9. The manufacturing method of the memory device of claim 7, further comprising:

forming a second drain region and a second source region in the substrate, wherein the second drain region and the second source region are respectively in mirror symmetry to the first drain region and the first source region with respect to the first word line or the second word line.

10. The manufacturing method of the memory device of claim 9, further comprising:

forming signal lines over the substrate, wherein the signal lines comprise a first drain line, a second drain line, a first source line and a second source line extending along the second direction and arranged along the first direction, wherein the first drain region and the first source region are respectively in electrical connection with the first drain line and the first source line, and wherein the second drain region and the second source region are respectively in electrical connection with the second drain line and the second source line.

11. The manufacturing method of the memory device of claim 10, further comprising:

forming interconnection structures over the substrate, wherein the interconnection structures extend along a direction parallel to the surface of the substrate, and is located between the substrate and the signal lines, and wherein the second drain region and the second source region are respectively in electrical connection with the second drain line and the second source line through the interconnection structures.

\* \* \* \* \*